United States Patent
Chiu

(10) Patent No.: US 9,059,673 B2
(45) Date of Patent: Jun. 16, 2015

(54) AMPLIFIER CIRCUIT AND OPERATION METHOD THEREOF

(71) Applicant: Novatek Microelectronics Corp., Hsinchu (TW)

(72) Inventor: Ying-Chung Chiu, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 52 days.

(21) Appl. No.: 14/088,454

(22) Filed: Nov. 25, 2013

(65) Prior Publication Data
US 2015/0091648 A1   Apr. 2, 2015

(30) Foreign Application Priority Data
Oct. 2, 2013   (TW) .............................. 102135759 A

(51) Int. Cl.
*H03F 3/45*    (2006.01)
*H03G 3/20*    (2006.01)

(52) U.S. Cl.
CPC ...................................... *H03G 3/20* (2013.01)

(58) Field of Classification Search
USPC ......................................... 330/254, 310, 311
IPC ......................................................... H03F 3/45
See application file for complete search history.

(56) References Cited

U.S. PATENT DOCUMENTS

| | | | | |
|---|---|---|---|---|
| 3,843,934 | A * | 10/1974 | Giles | 330/260 |
| 6,154,064 | A * | 11/2000 | Proebsting | 327/55 |
| 6,331,803 | B1 * | 12/2001 | Zheng et al. | 330/254 |
| 6,404,578 | B1 * | 6/2002 | Bhandari et al. | 360/61 |
| 7,701,289 | B2 | 4/2010 | Kuo et al. | |
| 7,719,352 | B2 * | 5/2010 | Kim et al. | 330/51 |
| 2008/0258818 | A1 * | 10/2008 | Ngo et al. | 330/282 |

* cited by examiner

*Primary Examiner* — Patricia T Nguyen
(74) *Attorney, Agent, or Firm* — Jianq Chyun IP Office

(57) ABSTRACT

An amplifier circuit and an operation method thereof are provided. The amplifier circuit includes two stages of amplifiers. When the amplifier circuit is operated in a high gain mode, the two stages of amplifiers are operated normally to provide high gain. When the amplifier circuit is operated in a low gain mode, the second stage of amplifier is turned off, and the first stage of amplifier is coupled to output terminals of the amplifier circuit through signal isolation elements so as to form a single stage of amplifier. Therefore, the amplifier circuit can change the total gain value thereof according to a requirement of gain.

17 Claims, 3 Drawing Sheets

AMPLIFIER CIRCUIT AND OPERATION METHOD THEREOF

CROSS-REFERENCE TO RELATED APPLICATION

This application claims the priority benefit of Taiwan application serial no. 102135759, filed on Oct. 2, 2013. The entirety of the above-mentioned patent application is hereby incorporated by reference herein and made a part of this specification.

BACKGROUND

1. Technical Field

The invention relates to an amplifier circuit and an operation method thereof. Particularly, the invention relates to an amplifier circuit capable of changing a gain value and an operation method thereof.

2. Related Art

In a communication system, the amplifier circuit is used for converting voltage levels of signals and isolating signals at an input terminal and an output signal thereof. The amplifier circuit is generally composed of at least one stage of amplifier, and a first stage of amplifier of the amplifier circuit is generally a low noise amplifier. The greater the gain of the first stage of amplifier is, regarding noise of a whole system, the smaller the noise component contributed by the post stage of amplifier is. Regarding a high-frequency amplifier, an iterative method is generally used to increase isolation between the input terminal and the output terminal. When the single stage of amplifier cannot reach a higher gain, a multi-stage cascade method can be used to reach the higher gain, though regarding an input signal with higher intensity, due to the influence of the multi-stage cascade, a whole linearity of the amplifier circuit is worse than that of the single stage of amplifier, which influences an operation of a post stage circuit.

SUMMARY

The invention is directed to an amplifier circuit and an operation method thereof, which is capable of changing a total gain value of the amplifier circuit.

The invention provides an amplifier circuit including a first transistor, a second transistor, a third transistor, a fourth transistor, a first load, a second load, a third load, a fourth load, a first signal isolation element, a second signal isolation element, a third signal isolation element, a fourth signal isolation element, a first current source, a second current source, a first switch and a second switch. The first transistor has a first terminal, a second terminal and a first control terminal, where the first control terminal receives an input signal. The first load is coupled between a first voltage and a first node. The first signal isolation element is coupled between the first node and the first terminal. The first current source is coupled between the second terminal and a second voltage. The second transistor has a third terminal, a fourth terminal and a second control terminal, where the second control terminal receives the input signal, and the fourth terminal is coupled to the second terminal. The second load is coupled between the first voltage and a second node. The second signal isolation element is coupled between the second node and the third terminal. The third transistor has a fifth terminal, a sixth terminal and a third control terminal, where the third control terminal is coupled to the first node, and the fifth terminal is coupled to a third node. The third load is coupled between the first voltage and the third node. The third signal isolation element is coupled between the third node and the first terminal. The second current source is coupled between the sixth terminal and the second voltage. The fourth transistor has a seventh terminal, an eighth terminal and a fourth control terminal, where the forth control terminal is coupled to the second node, the seventh terminal is coupled to a fourth node, and the eighth terminal is coupled to the sixth terminal. The fourth load is coupled between the first voltage and the fourth node. The fourth signal isolation element is coupled between the fourth node and the third terminal. The first switch is coupled between the third control terminal and the second voltage. The second switch is coupled between the fourth control terminal and the second voltage.

In an embodiment of the invention, the first signal isolation element, the second signal isolation element, the third signal isolation element and the fourth signal isolation element respectively include a transistor.

In an embodiment of the invention, a length and a width of a channel layer of the transistor of the first signal isolation element are the same to a length and a width of a channel layer of the transistor of the third signal isolation element, and a length and a width of a channel layer of the transistor of the second signal isolation element are the same to a length and a width of a channel layer of the transistor of the fourth signal isolation element.

In an embodiment of the invention, when the transistors of the first signal isolation element and the second signal isolation element are turned on, the transistors of the third signal isolation element and the fourth signal isolation element are turned off; and when the transistors of the third signal isolation element and the fourth signal isolation element are turned on, the transistors of the first signal isolation element and the second signal isolation element are turned off.

In an embodiment of the invention, when the transistors of the third signal isolation element and the fourth signal isolation element are turned on, the first switch and the second switch are turned on; and when the transistors of the third signal isolation element and the fourth signal isolation element are turned off, the first switch and the second switch are turned off.

In an embodiment of the invention, the amplifier circuit further includes a gain control unit. The gain control unit receives the input signal, and is coupled to the transistors of the first signal isolation element, the second signal isolation element, the third signal isolation element and the fourth signal isolation element, and is coupled to the first switch and the second switch, and is configured to provide a first control signal to control terminals of the transistors of the first signal isolation element and the second signal isolation element, and provide a second control signal to control terminals of the transistors of the third signal isolation element and the fourth signal isolation element and to the first switch and the second switch. The gain control unit determines voltage levels of the first control signal and the second control signal according to the input signal.

In an embodiment of the invention, the first control signal and the second control signal are inverted to each other.

In an embodiment of the invention, the fifth terminal is directly coupled to the third node, and the seventh terminal is directly coupled to the fourth node.

In an embodiment of the invention, the first switch is directly coupled to the third control terminal, and the second switch is directly coupled to the fourth control terminal.

In an embodiment of the invention, the first load, the second load, the third load and the fourth load respectively include an inductor.

In an embodiment of the invention, the first load further includes a first capacitor coupled between the first node and the third control terminal. The second load further includes a second capacitor coupled between the second node and the fourth control terminal.

In an embodiment of the invention, the first voltage is a system voltage, and the second voltage is a ground voltage.

The invention provides an operation method, which is adapted to the aforementioned amplifier circuit and includes following steps. An operation mode of the amplifier circuit is determined according to the input signal. When the operation mode of the amplifier circuit is a high gain mode, the first signal isolation element and the second signal isolation element are enabled, and the third signal isolation element and the fourth signal isolation element are disabled. When the operation mode of the amplifier circuit is a low gain mode, the first signal isolation element and the second signal isolation element are disabled, and the third signal isolation element and the fourth signal isolation element are enabled.

In an embodiment of the invention, the operation method of the amplifier circuit further includes following steps. When the operation mode of the amplifier circuit is the high gain mode, the first switch and the second signal switch are disabled. When the operation mode of the amplifier circuit is the low gain mode, the first switch and the second signal switch are enabled.

According to the above descriptions, in the amplifier circuit and the operation method thereof, the gain control unit controls the amplifier circuit to be a single stage of amplifier or a multi-stage of amplifier according to the input signal, so as to change the total gain value of the amplifier circuit according to an actual amplification requirement.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
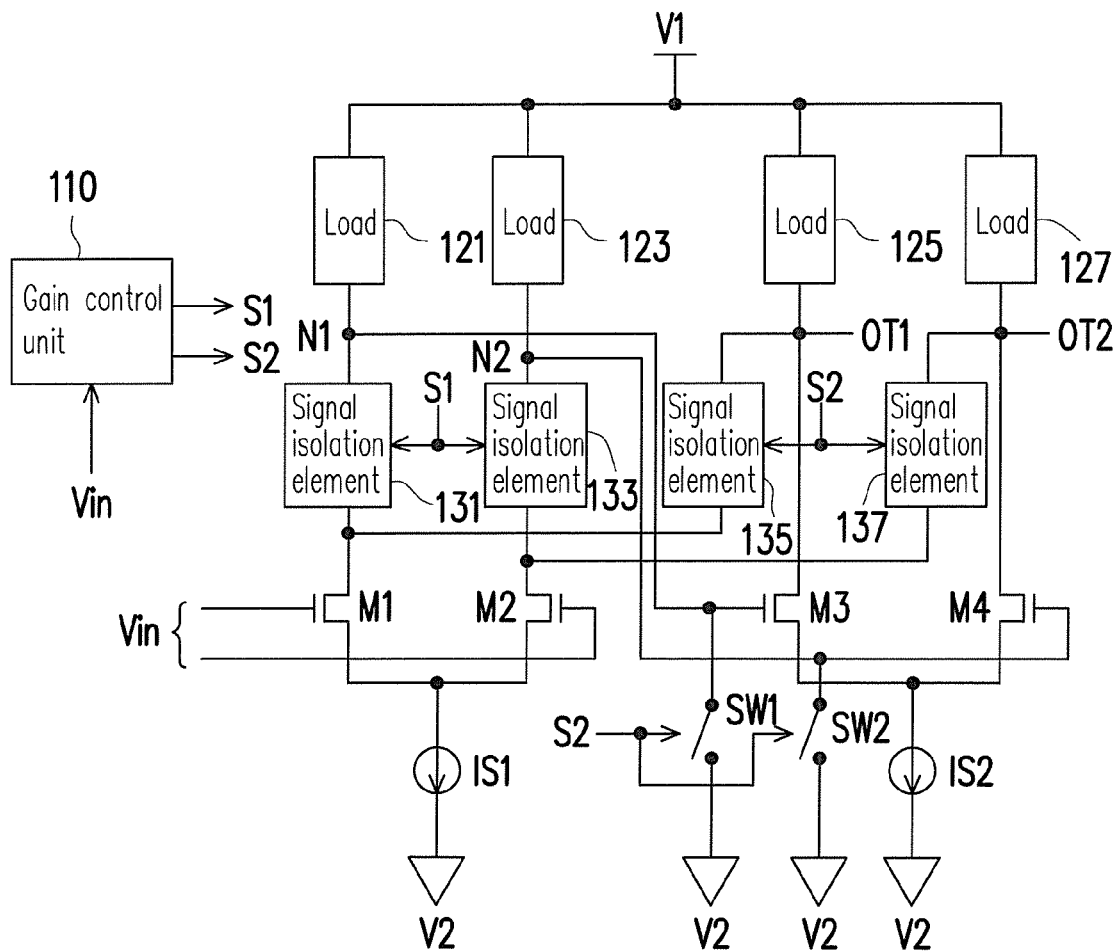
FIG. 1 is a system schematic diagram of an amplifier circuit according to an embodiment of the invention.

FIG. 1 is a system schematic diagram of an amplifier circuit according to an embodiment of the invention. Referring to FIG. 1, in the present embodiment, the amplifier circuit 100 includes a gain control unit 110, a first load 121, a second load 123, a third load 125, a fourth load 127, a first signal isolation element 131, a second signal isolation element 133, a third signal isolation element 135, a fourth signal isolation element 137, a first transistor M1, a second transistor M2, a third transistor M3, a fourth transistor M4, a first current source IS1, a second current source IS2, a first switch SW1 and a second switch SW2.

The gain control unit 110 receives an input signal Vin, and is coupled to the first signal isolation element 131, the second signal isolation element 133, the third signal isolation element 135, the fourth signal isolation element 137, the first switch SW1 and the second switch SW2. The gain control unit 110 provides a first control signal S1 to the first signal isolation element 131 and the second signal isolation element 133 according to the input signal Vin, and provide a second control signal S2 to the third signal isolation element 135, the fourth signal isolation element 137, the first switch SW1 and the second switch SW2.

The input signal Vin can be a differential signal or a single terminal signal. A gate (corresponding to a first control terminal) of the first transistor M1 receives the input signal Vin. The first load 121 is coupled between a first voltage V1 and a first node N1. The first signal isolation element 131 is coupled between the first node N1 and a first terminal (for example, a drain) of the first transistor M1. The first current source IS1 is coupled between a second terminal (for example, a source) of the first transistor M1 and a second voltage V2.

A gate (corresponding to a second control terminal) of the second transistor M2 receives the input signal Vin, and a fourth terminal (for example, a source) of the second transistor M2 is coupled to the source of the first transistor M1. The second load 123 is coupled between the first voltage V1 and a second node N2. The second signal isolation element 133 is coupled between the second node N2 and a third terminal (for example, a drain) of the second transistor M2.

A gate (corresponding to a third control terminal) of the third transistor M3 is coupled to the first node N1, a fifth terminal (for example, a drain) of the third transistor M3 is coupled to a third node OT1. The third load 125 is coupled between the first voltage V1 and the third node OT1. The third signal isolation element 135 is coupled between the third node OT1 and the grain of the first transistor M1. The second current source IS2 is coupled between a sixth terminal (for example, a source) of the third transistor M3 and the second voltage V2.

A gate (corresponding to a fourth control terminal) of the fourth transistor M4 is coupled to the second node N2, and a seventh terminal (for example, a drain) of the fourth transistor M4 is coupled to a fourth node OT2. An eighth terminal (for example, a source) of the fourth transistor M4 is coupled to the source of the third transistor M3. The fourth load 127 is coupled between the first voltage V1 and the fourth node OT2. The fourth signal isolation element 137 is coupled between the fourth node OT2 and the drain of the second transistor M2.

The first switch SW1 is coupled between the gate of the third transistor M3 and the second voltage V2. The second switch SW2 is coupled between the gate of the fourth transistor M4 and the second voltage V2. A combination of the first load 121, the second load 123, the first signal isolation element 131, the second signal isolation element 133, the first transistor M1, the second transistor M2 and the first current source IS1 can be regarded as a first stage of amplifier, and a combination of the third load 125, the fourth load 127, the third transistor M3, the fourth transistor M4 and the second current source IS2 can be regarded as a second stage of amplifier.

In the present embodiment, the gain control unit 110 determines voltage levels of the first control signal S1 and the second control signal S2 according to the input signal Vin. In other words, the gain control unit 110 may detect amplitude of the input signal Vin to determine a signal intensity of the input signal Vin, and determines an operation mode of the amplifier circuit 100 according to the signal intensity of the input signal Vin. When the signal intensity of the input signal Vin is lower than a threshold value, the gain control unit 110 determines the amplifier circuit 100 to operate in a high gain mode (i.e. the operation mode is the high gain mode). Conversely, when the signal intensity of the input signal Vin is higher than or equal to the above threshold value, the gain control unit 110 determines the amplifier circuit 100 to operate in a low gain mode (i.e. the operation mode is the low gain mode). The aforementioned threshold value is determined by a maximum gain value of the first stage of amplifier.

When the amplifier circuit 100 operates in the high gain mode, the gain control unit 110 controls the first signal isolation element 131 and the second signal isolation element 133 to present a turn-on state through the first control signal S1, and the gain control unit 110 controls the third signal isolation element 135, the fourth signal isolation element 137, the first switch SW1 and the second switch SW2 to present a turn-off state through the second control signal S2. Now, the input signal Vin is amplified by the first transistor M1, the second transistor M2, the third transistor M3 and the fourth transistor M4, and is output through the first output terminal OT1 and the second output terminal OT2. Namely, the amplifier circuit 100 can be regarded as two stages of differential amplifiers connected in series, and achieves the high gain effect by connecting the amplifiers in series.

When the amplifier circuit 100 is operated in the low gain mode, the gain control unit 110 controls the first signal isolation element 131 and the second signal isolation element 133 to present the turn-off state through the first control signal S1, and the gain control unit 110 controls the third signal isolation element 135, the fourth signal isolation element 137, the first switch SW1 and the second switch SW2 to present the turn-on state through the second control signal S2. Now, the input signal Vin is amplified by the first transistor M1 and the second transistor M2 and is output through the first output terminal OT1 and the second output terminal OT2. Namely, the amplifier circuit 100 can be regarded as a single stage of differential amplifiers, and achieves the low gain effect through the single stage of amplifier.

In an embodiment of the invention, a signal isolation of the third signal isolation element 135 can be designed to be the same to the signal isolation of the first signal isolation element 131, and the signal isolation of the fourth signal isolation element 137 can be designed to be the same to the signal isolation of the second signal isolation element 133. In this way, in the high gain mode or the low gain mode, the signal isolation of the single stage of amplifier of the amplifier circuit 100 can be substantially the same.

In some embodiments, the first voltage V1 can be a system voltage, and the second voltage V2 can be a ground voltage, though the invention is not limited thereto. Moreover, when the amplifier circuit 100 is switched between the high gain mode and the low gain mode, the first control signal S1 and the second control signal S2 can be inverted to each other. Namely, when the first control signal S1 has a high voltage level, the second control signal S2 has a low voltage level; and when the first control signal S1 has the low voltage level, the second control signal S2 has the high voltage level.

In a part of the embodiments of the invention, the drain of the third transistor M3 is directly coupled to the third node OT1, and the drain of the fourth transistor M4 is directly coupled to the fourth node OT2. The third node OT1 and the fourth node OT2 may serve as output terminals of the amplifier circuit of FIG. 1. Moreover, the first switch SW1 can be directly coupled to the gate of the third transistor M3, and the second switch SW2 can be directly coupled to the gate of the fourth transistor M4.

Figure 2:
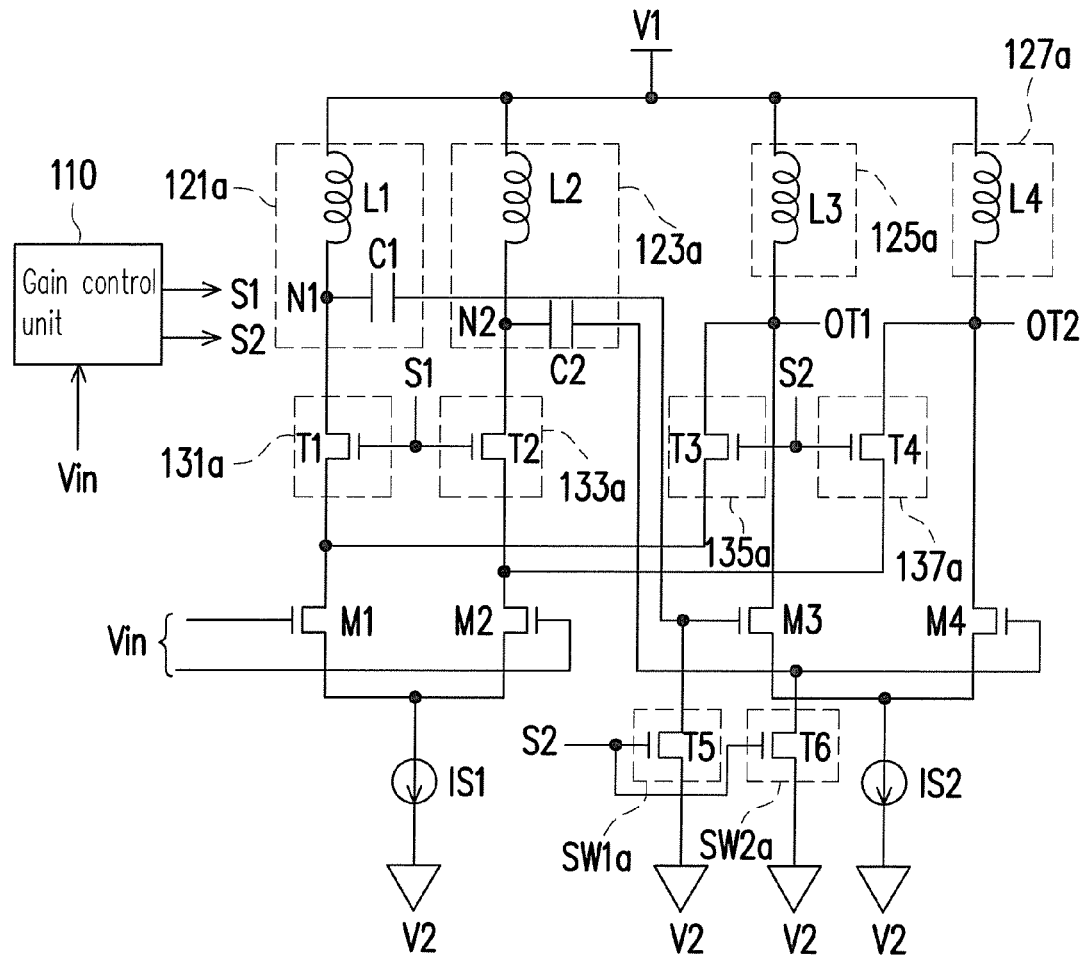
FIG. 2 is a circuit schematic diagram of an amplifier circuit according to another embodiment of the invention.

FIG. 2 is a circuit schematic diagram of an amplifier circuit according to an embodiment of the invention. Referring to FIG. 1 and FIG. 2, in the present embodiment, the amplifier circuit 200 is approximately the same to the amplifier circuit 100, and a difference there between lies in a first load 121a, a second load 123a, a third load 125a, a fourth load 127a, a first signal isolation element 131a, a second signal isolation element 133a, a third signal isolation element 135a, a fourth signal isolation element 137a, a first switch SW1a and a second switch SW2a, where the same or similar components are denoted by the same or similar referential numbers.

The first load 121a includes an inductor L1 and a first capacitor C1, where the first capacitor C1 is coupled between the first node N1 and the gate of the third transistor M3. The second load 123a includes an inductor L2 and a second capacitor C2, where the second capacitor C2 is coupled between the second node N2 and the gate of the fourth transistor M4. The third load 125a includes an inductor L3. The fourth load 127a includes an inductor L4. The first signal isolation element 131a includes a transistor T1. The second signal isolation element 133a includes a transistor T2. The third signal isolation element 135a includes a transistor T3. The fourth signal isolation element 137a includes a transistor T4. The first switch SW1a includes a transistor T5. The second switch SW2a includes a transistor T6.

According to the above descriptions, the amplifier circuit 200 can be regarded as a high-frequency amplifier circuit, and a direct current (DC) component of the first node N1 and the second node N2 can be filtered through the first capacitor C1 and the second capacitor C2, i.e. the first capacitor C1 and the second capacitor C2 can be regarded as AC-coupling capacitors of the first stage of amplifier and the second stage of amplifier. The transistors T1-T4 are used for isolating the input terminal (i.e. the gates of the transistors M1 and M2) of the amplifier circuit 200 from the first output ten final OT1 and the second output terminal OT2.

In an embodiment of the invention, a size of the transistor T3 can be the same to a size of the transistor T1, i.e. a length and a width of a channel layer of the transistor T3 can be the same to a length and a width of a channel layer of the transistor T1, such that the signal isolation of the third signal isolation element 135a is the same to the signal isolation of the first signal isolation element 131a. Moreover, a size of the transistor T4 can be the same to a size of the transistor T2, i.e. a length and a width of a channel layer of the transistor T4 can be the same to a length and a width of a channel layer of the transistor T2, such that the signal isolation of the fourth signal isolation element 137a is the same to the signal isolation of the second signal isolation element 133a.

When the amplifier circuit 200 is operated in the high gain mode, the gain control unit 110 controls the transistors T1 and T2 to present the turn-on state through the first control signal S1, and the gain control unit 110 controls the transistors T3-T6 to present the turn-off state through the second control signal S2. When the amplifier circuit 200 is operated in the low gain mode, the gain control unit 110 controls the transistors T1 and T2 to present the turn-off state through the first control signal S1, and the gain control unit 110 controls the transistors T3-T6 to present the turn-on state through the second control signal S2.

Figure 3:
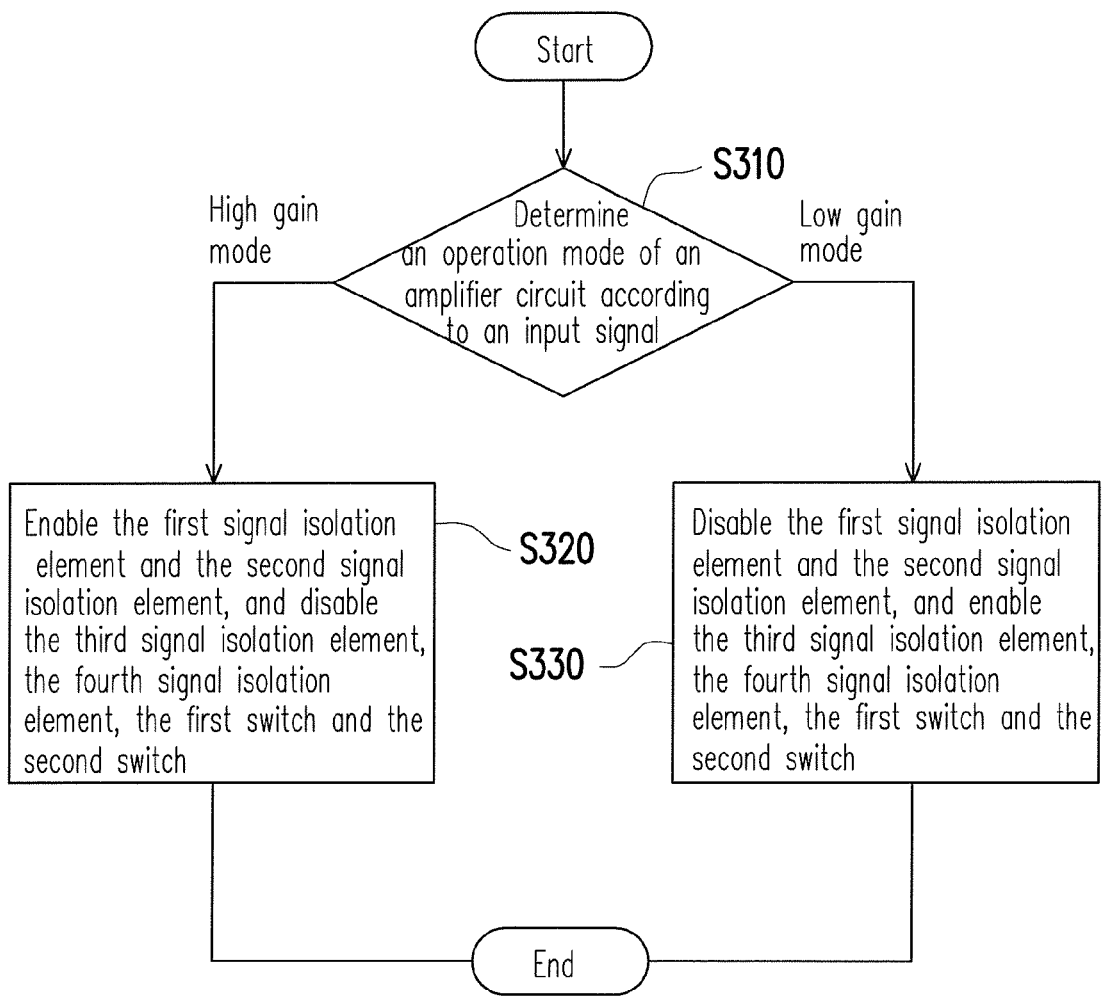
FIG. 3 is a flowchart illustrating an operation method of an amplifier circuit according to an embodiment of the invention.

FIG. 3 is a flowchart illustrating an operation method of the amplifier circuit according to an embodiment of the invention. Referring to FIG. 1 and FIG. 3, the operation method of the amplifier circuit of the present embodiment is adapted to the amplifier circuit 100. In step S310, an operation mode of the amplifier circuit 100 is determined according to an input signal Vin. When the operation mode of the amplifier circuit 100 is a high gain mode, the first signal isolation element 131 and the second signal isolation element 133 are enabled, and the third signal isolation element 135, the fourth signal isolation element 137, the first switch SW1 and the second switch SW2 are disabled (step S320). When the operation mode of the amplifier circuit 100 is a low gain mode, the first signal isolation element 131 and the second signal isolation element 133 are disabled, and the third signal isolation element 135, the fourth signal isolation element 137, the first switch SW1 and the second switch SW2 are enabled (step S330). The sequence of the steps S310, S320 and S330 is only an example, and the invention is not limited thereto. Moreover, details of the steps S310, S320 and S330 may refer to the embodiments of FIG. 1 and FIG. 2, and are not repeated.

In summary, according to the amplifier circuit of the invention and the operation method thereof, the gain control unit controls the amplifier circuit to be the single stage of amplifier or the multi-stage of amplifiers according to the input signal, so as to change the total gain value of the amplifier circuit according to an actual amplification requirement. Moreover, the signal isolation of the third signal isolation element can be designed to be the same to the signal isolation of the first signal isolation element, and the signal isolation of the fourth signal isolation element can be designed to be the same to the signal isolation of the second signal isolation element, such that the signal isolation of the single stage of amplifier of the amplifier circuit 100 is substantially the same in case of different gain values.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An amplifier circuit, comprising:
   a first transistor, having a first terminal, a second terminal and a first control terminal, wherein the first control terminal receives an input signal;
   a first load, coupled between a first voltage and a first node;
   a first signal isolation element, coupled between the first node and the first terminal of the first transistor;
   a first current source, coupled between the second terminal of the first transistor and a second voltage;
   a second transistor, having a third terminal, a fourth terminal and a second control terminal, wherein the second control terminal receives the input signal, and the fourth terminal is coupled to the second terminal of the first transistor;
   a second load, coupled between the first voltage and a second node;
   a second signal isolation element, coupled between the second node and the third terminal of the second transistor;
   a third transistor, having a fifth terminal, a sixth terminal and a third control terminal, wherein the third control terminal is coupled to the first node, and the fifth terminal is coupled to a third node;
   a third load, coupled between the first voltage and the third node;
   a third signal isolation element, coupled between the third node and the first terminal of the first transistor;
   a second current source, coupled between the sixth terminal of the third transistor and the second voltage;
   a fourth transistor, having a seventh terminal, an eighth terminal and a fourth control terminal, wherein the forth control terminal is coupled to the second node, the seventh terminal is coupled to a fourth node, and the eighth terminal is coupled to the sixth terminal of the third transistor;
   a fourth load, coupled between the first voltage and the fourth node;
   a fourth signal isolation element, coupled between the fourth node and the third terminal of the second transistor;
   a first switch, coupled between the third control terminal of the third transistor and the second voltage; and
   a second switch, coupled between the fourth control terminal of the fourth transistor and the second voltage.

2. The amplifier circuit as claimed in claim 1, wherein the first signal isolation element, the second signal isolation element, the third signal isolation element and the fourth signal isolation element respectively comprise a transistor.

3. The amplifier circuit as claimed in claim 2, wherein a length and a width of a channel layer of the transistor of the first signal isolation element are the same to a length and a width of a channel layer of the transistor of the third signal isolation element, and a length and a width of a channel layer of the transistor of the second signal isolation element are the same to a length and a width of a channel layer of the transistor of the fourth signal isolation element.

4. The amplifier circuit as claimed in claim 2, wherein the transistors of the third signal isolation element and the fourth signal isolation element are turned off when the transistors of the first signal isolation element and the second signal isolation element are turned on; and the transistors of the first signal isolation element and the second signal isolation element are turned off when the transistors of the third signal isolation element and the fourth signal isolation element are turned on.

5. The amplifier circuit as claimed in claim 4, wherein the first switch and the second switch are turned on when the transistors of the third signal isolation element and the fourth signal isolation element are turned on; and the first switch and the second switch are turned off when the transistors of the third signal isolation element and the fourth signal isolation element are turned off.

6. The amplifier circuit as claimed in claim 2, further comprising:
   a gain control unit, receiving the input signal, coupled to the transistors of the first signal isolation element, the second signal isolation element, the third signal isolation element and the fourth signal isolation element, and coupled to the first switch and the second switch, and configured to provide a first control signal to control terminals of the transistors of the first signal isolation element and the second signal isolation element, and provide a second control signal to control terminals of the transistors of the third signal isolation element and the fourth signal isolation element and provide the second control signal to the first switch and the second switch, wherein the gain control unit determines voltage levels of the first control signal and the second control signal according to the input signal.

7. The amplifier circuit as claimed in claim 6, wherein the first control signal and the second control signal are inverted to each other.

8. The amplifier circuit as claimed in claim 1, wherein the fifth terminal of the third transistor is directly coupled to the third node, and the seventh terminal of the fourth transistor is directly coupled to the fourth node.

9. The amplifier circuit as claimed in claim 1, wherein the first switch is directly coupled to the third control terminal of the third transistor, and the second switch is directly coupled to the fourth control terminal of the fourth transistor.

10. The amplifier circuit as claimed in claim 1, wherein the first load, the second load, the third load and the fourth load respectively comprise an inductor.

11. The amplifier circuit as claimed in claim 10, wherein the first load further includes a first capacitor coupled between the first node and the third control terminal of the third transistor; and the second load further comprises a second capacitor coupled between the second node and the fourth control terminal of the fourth transistor.

12. The amplifier circuit as claimed in claim 1, wherein the first voltage is a system voltage, and the second voltage is a ground voltage.

13. The amplifier circuit as claimed in claim 1, wherein the first signal isolation element and the second signal isolation element are disabled, the third signal isolation element and the fourth signal isolation element are enabled, and the first switch and the second switch are turned on when an operation mode of the amplifier circuit is a low gain mode; and the first signal isolation element and the second signal isolation element are enabled, the third signal isolation element and the fourth signal isolation element are disabled, and the first switch and the second switch are turned off when the operation mode of the amplifier circuit is a high gain mode.

14. The amplifier circuit as claimed in claim 13, wherein the operation mode of the amplifier circuit is the low gain mode when an intensity of the input signal is greater than a threshold value; and the operation mode of the amplifier circuit is the high gain mode when the intensity of the input signal is smaller than the threshold value.

15. An operation method, adapted to the amplifier circuit as claimed in claim 1, the operation method comprising:

determining an operation mode of the amplifier circuit according to the input signal;

enabling the first signal isolation element and the second signal isolation element, and disabling the third signal isolation element and the fourth signal isolation element when the operation mode of the amplifier circuit is a high gain mode; and disabling the first signal isolation element and the second signal isolation element, and enabling the third signal isolation element and the fourth signal isolation element when the operation mode of the amplifier circuit is a low gain mode.

16. The operation method as claimed in claim 15, further comprising:

disabling the first switch and the second signal switch when the operation mode of the amplifier circuit is the high gain mode; and enabling the first switch and the second signal switch when the operation mode of the amplifier circuit is the low gain mode.

17. The operation method as claimed in claim 15, wherein the step of determining the operation mode of the amplifier circuit according to the input signal comprises:

determining the operation mode of the amplifier circuit to be the low gain mode when an intensity of the input signal is greater than a threshold value; and determining the operation mode of the amplifier circuit to be the high gain mode when the intensity of the input signal is smaller than the threshold value.

* * * * *